(12) United States Patent
Mitarai et al.

(10) Patent No.: US 8,432,316 B2
(45) Date of Patent: Apr. 30, 2013

(54) HIGH FREQUENCY DEVICE

(75) Inventors: Shun Mitarai, Kanagawa (JP);
Minehiro Tonosaki, Kanagawa (JP);
Koichi Ikeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 334 days.

(21) Appl. No.: 12/860,140

(22) Filed: Aug. 20, 2010

(65) Prior Publication Data
US 2011/0050368 A1     Mar. 3, 2011

(30) Foreign Application Priority Data

Aug. 27, 2009   (JP) ................ 2009-197153

(51) Int. Cl.
*H01Q 1/38*     (2006.01)
*H01Q 5/00*     (2006.01)
*H01Q 9/04*     (2006.01)

(52) U.S. Cl.
USPC .............. 343/700 MS; 343/895; 343/767

(58) Field of Classification Search ................. None
See application file for complete search history.

(56) References Cited

U.S. PATENT DOCUMENTS 7,381,607 B2 *   6/2008   Harris et al. ............... 438/210
2010/0044853 A1 *  2/2010   Dekker et al. ............. 257/692

FOREIGN PATENT DOCUMENTS

JP     2002-222912     8/2002

\* cited by examiner

*Primary Examiner* — Anh Tran
(74) *Attorney, Agent, or Firm* — Dentons US LLP

(57) ABSTRACT

A high frequency device having a membrane structure with improved mechanical strength is provided. The high frequency device includes: a substrate having an aperture; a first dielectric layer that is formed from a material having etching selectivity in relation to a material of the substrate and is provided on the substrate to cover the aperture; a second dielectric layer on the first dielectric layer; and a high frequency element provided in a position opposed to the aperture on the second dielectric layer.

20 Claims, 8 Drawing Sheets

HIGH FREQUENCY DEVICE

BACKGROUND OF THE INVENTION

1. Field of the Invention

The present invention relates to a high frequency device used for MEMS (Micro Electro Mechanical Systems).

2. Description of the Related Art

Along with miniaturization of Si-CMOS (Complementary Metal Oxide Semiconductor), transistor shielding frequency has been drastically improved up to 100 GHz or more. Thereby, it is needless to say that application to several GHz band mainly used in current wireless devices is enabled, and in addition, it is prospective that application to 60 GHz or more millimeter waveband will be enabled. Such an application is a so-called RF-CMOS circuit. By integrating a base band section and an RF front end section into one chip by the CMOS, largely lowered cost is allowed to be realized, and thus active development of the RF-CMOS circuit has been made.

One of tasks in developing the RF-CMOS circuit is, for example, an inductor. In the RF-CMOS, an Si substrate having lower resistance (from several to several kωcm both inclusive) than that of a semi-insulating GaAs substrate used in compound semiconductor is used. Thus, in the case where the inductor is formed on the substrate, capacitive coupling with the substrate, eddy current loss and the like arise. In the result, Q value of the CMOS on-chip inductor is decreased, which is one of obstacles to realizing low power consumption and low cost of the RF-CMOS circuit.

As a trial to improve the Q value of high frequency elements including the inductor, the following trial has been made. That is, by removing part of the substrate, parasitic capacity between the high frequency element and the substrate is tried to be decreased, or loss by an eddy current is tried to be suppressed. For example, the following example has been reported (for example, C. Y. Chi and G. M. Rebeiz, "Planer microwave and millimeter-wave lumped elements and coupled-line filters using micromachining techniques," IEEE Trans. Microwave Theory Tech., vol. 43, No. 4, pp. 730-738, 1995). In the example, an inductor is provided on a membrane formed by etching from the rear face of a Si substrate by potassium hydrate. Thereby, resonance frequency is improved, and a high Q value (from 50 to 60 both inclusive at from 30 to 40 GHz both inclusive) is realized. Further, there is another example as follows (for example, Japanese Unexamined Patent Application Publication No. 2002-222912). In the example, in a high frequency MCM (Multi Chip Module), a substrate is selectively removed by DRIE (Deep Reactive Ion Etching) from the rear face of the substrate, and a filter and an antenna are formed on an organic thin film (membrane) composed of benzocyclobutene (BCB) or the like. Thereby, acute frequency characteristics with small loss are realized.

SUMMARY OF THE INVENTION

However, in general, mechanical strength of the foregoing membrane structure (thin film structure) is weak. Further, the strength is further decreased by damaging the membrane in etching for removing the substrate from the rear face thereof. In particular, in the case where the designed film thickness of the membrane is small or the area thereof is large, chip handling in mounting becomes difficult, and in addition, membrane self-support itself is in trouble. Meanwhile, for example, in the case of the inductor and the antenna, if a necessary characteristics value is tried to be realized, element dimensions are determined almost uniquely. Thus, in the case where an element with a relatively large area such as the inductor and the antenna is formed on the membrane structure, the yield ratio is decreased in terms of strength issue. To resolve such an event, there is a disadvantage that wiring design dimensions should be increased, for example, the thickness of the membrane should be increased.

In view of the foregoing disadvantages, in the invention, it is desirable to provide a high frequency device having a membrane structure with improved mechanical strength.

According to an embodiment of the invention, there is provided a first high frequency device including: a substrate having an aperture; a first dielectric layer that is formed from a material having etching selectivity in relation to a material of the substrate and is provided on the substrate to cover the aperture; a second dielectric layer on the first dielectric layer; and a high frequency element provided in a position opposed to the aperture on the second dielectric layer.

In the first high frequency device, a stopper layer (first dielectric layer) is provided between the substrate and the second dielectric layer as an element formation layer. Thus, in forming the aperture by etching from the rear face side of the substrate, the element formation layer (second dielectric layer) is not damaged.

According to an embodiment of the invention, there is provided a second high frequency device including: a substrate having an aperture; a dielectric layer provided on the substrate to cover the aperture; a high frequency element provided in a position opposed to the aperture on the dielectric layer; and a reinforced structure for the dielectric layer that is integrated with the substrate, and has a pattern dividing inside of the aperture into a plurality of regions.

In the second high frequency device, by the reinforced structure in the aperture that is integrated with the substrate, mechanical strength of the dielectric layer as a device formation layer is increased.

According to the first high frequency device of the embodiment of the invention, the first dielectric layer as the stopper layer is provided between the substrate and the second dielectric layer as the element formation layer. Thus, the element formation layer (second dielectric layer) is able to be prevented from being damaged by etching in forming the aperture in the substrate. Therefore, mechanical strength is improved, and the manufacturing yield ratio is improved.

According to the second high frequency device of the embodiment of the invention, the reinforced structure integrated with the substrate is provided in the aperture of the substrate, and inside of the aperture is divided into the plurality of regions. Thus, as in the first high frequency device, mechanical strength of the element formation layer (dielectric layer) is improved, and the manufacturing yield ratio is improved.

Other and further objects, features and advantages of the invention will appear more fully from the following description.

DETAILED DESCRIPTION OF THE PREFERRED EMBODIMENTS

Figure 1:
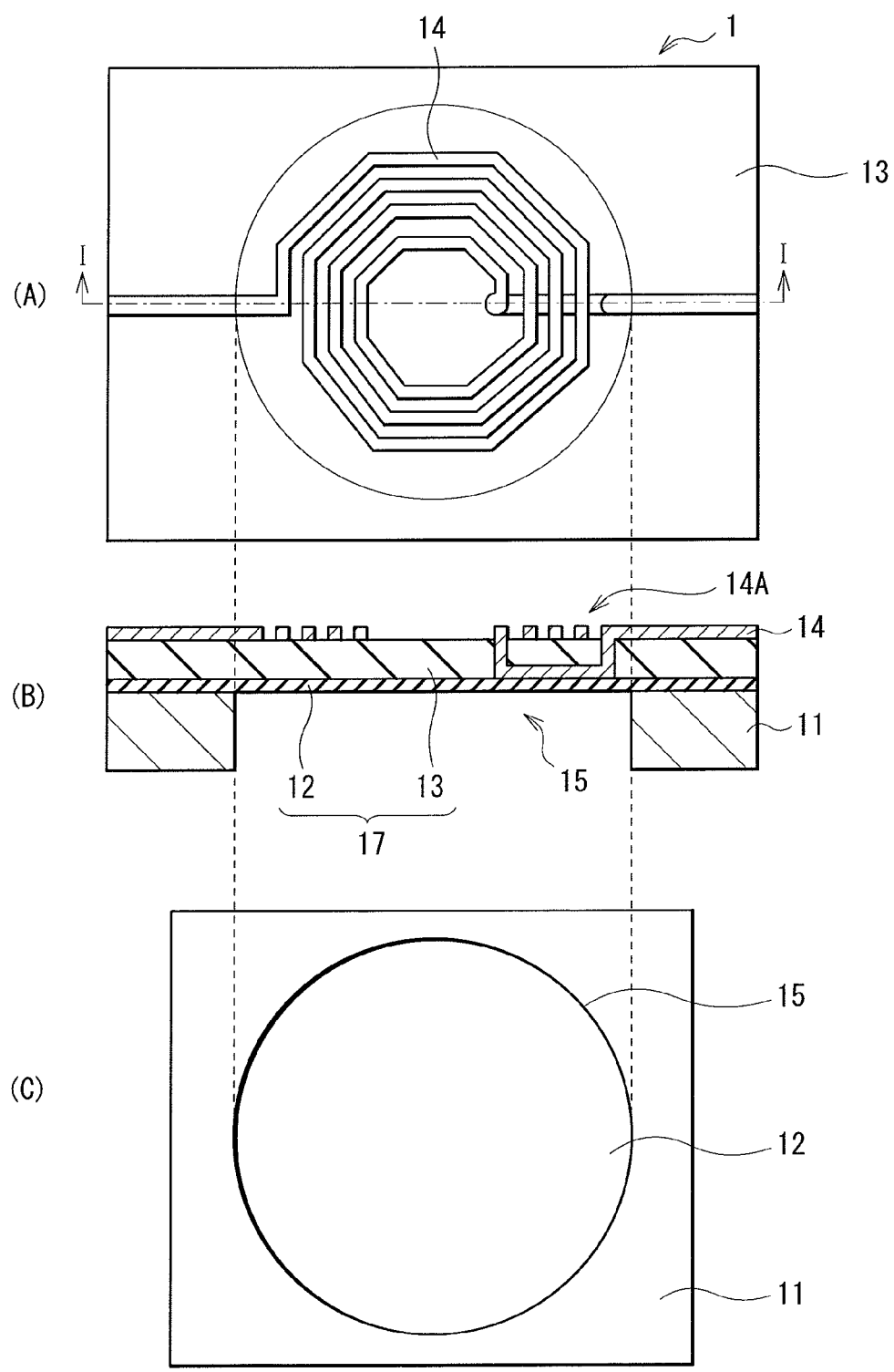
FIG. 1 is planar views and a cross sectional view of a high frequency device according to a first embodiment of the invention.

Embodiments of the invention will be hereinafter described with reference to the drawings in the following order:
First embodiment
(1) Whole configuration
(2) Manufacturing method
Second embodiment
Whole configuration of a high frequency device having a reinforced structure
Third embodiment
High frequency device having an antenna as a high frequency element
Fourth embodiment
Mounting example
1. First Embodiment
 (1) Whole Configuration
FIG. 1 illustrates a configuration of a high frequency device 1 according to a first embodiment of the invention. Part A in FIG. 1 illustrates a planar configuration of the high frequency device 1 viewed from the top face thereof. Part B in FIG. 1 illustrates a cross sectional structure taken along line I-I of part A in FIG. 1. Part C in FIG. 1 illustrates a planar configuration of the high frequency device 1 viewed from the bottom face thereof. The high frequency device 1 has a configuration in which a stopper layer 12 as a membrane and a dielectric layer 13 are layered in this order over a substrate 11. On the dielectric layer 13 (element formation layer), a high frequency element 14 is formed. In the substrate 11, an aperture 15 is formed by removing part of the substrate 11.

The substrate 11 is, for example, a silicon substrate. The substrate 11 may be made of other material such as synthetic quarts, glass, a metal, a resin and a resin film.

The stopper layer 12 (first dielectric layer) is made of a dielectric material containing, for example, silicon (Si). It is enough that the material of the stopper layer 12 has selectivity in relation to the substrate 11 in etching the substrate 11, and is selected as appropriate according to the material of the substrate 11. Etching means dry etching such as DRIE (Deep Reactive Ion Etching), but is not limited thereto. For example, wet etching may be used as well.

The dielectric layer 13 (second dielectric layer) as the element formation layer is made of an organic material or an inorganic material. The material is selected by taking account of the dimensions, the film thickness, demanded high frequency characteristics and the like. As the organic material, for example, a low-permittivity material such as benzocyclobutene (BCB), polyimide (PI), parylene, and diamond-like carbon (DLC) is able to be used. As the inorganic material, for example, a material containing a main component of, for example, $SiO_2$ or SiN is used. The organic material has an advantage that the high frequency characteristics are high and a thick film is easily formed. Meanwhile, the inorganic material has an advantage that a stress is hardly generated since the thermal expansion difference with Si is small, though a thick film is difficult to form.

The high frequency element 14 is a coil-like inductor 14A made of a metal material such as AlCu. In this case, the inductor 14A has a two-layer structure, but may have one layer structure. The high frequency element 14 is formed in the position opposed to the aperture 15 formed in the substrate 11 (in the aperture 15).

Next, a description will be given of a method of manufacturing the high frequency device 1 with reference to FIGS. 2A to 2C and FIGS. 3A to 3C.

Figure 2A:
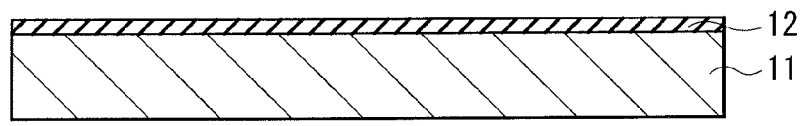
FIGS. 2A to 2C are cross sectional views illustrating an example of a method of manufacturing the high frequency device illustrated in FIG. 1.

(2) Manufacturing Method
First, as illustrated in FIG. 2A, the stopper layer 12 is formed on the substrate 11. In this case, since the material of the substrate 11 is silicon, as the stopper layer 12, a silicon oxide film having etching selectivity in relation to silicon is formed. Specifically, for example, the silicon substrate 11 having a thickness of 0.6 mm is heated at 1000 deg C. to form the silicon oxide film having a thickness of 3 μm on the front face of the substrate 11 by thermal oxidation under water vapor atmosphere. Next, a silicon oxide layer on one side (rear face) of the substrate 11 is polished and removed to obtain the thickness of the substrate 11 of, for example, 0.5 mm. Thereby, the stopper layer 12 composed of a silicon oxide film is formed on the front face of the substrate 11.

Figure 2B:
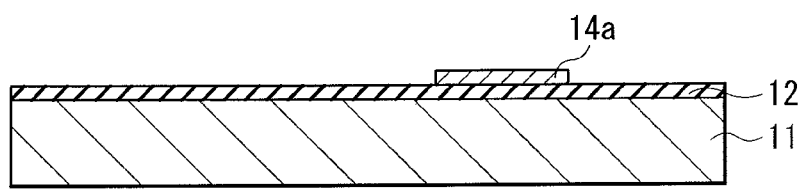
Figure 2C:
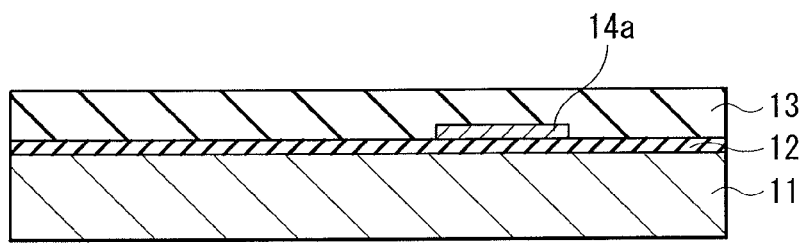

Subsequently, as illustrated in FIG. 2B, for example, AlCu is deposited on the stopper layer 12. The resultant is formed into a given shape by, for example, dry etching, and thereby a metal wiring 14a as a first layer is formed. Subsequently, as illustrated in FIG. 2C, the dielectric film 13 is formed on the stopper layer 12 and the metal wiring 14a. In this case, the dielectric film 13 is formed by spin coat method by using, for example, BCB as a low-permittivity material with low loss in high frequency.

Figure 3A:
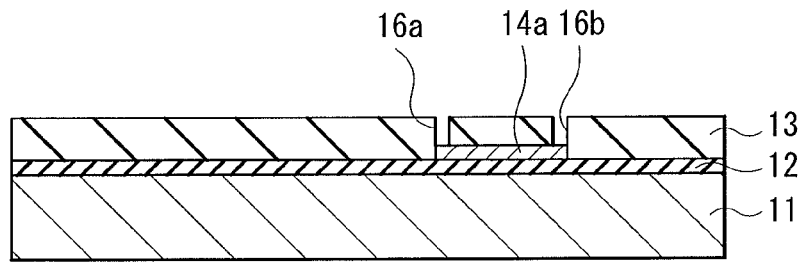
FIGS. 3A to 3C are cross sectional views illustrating steps following FIGS. 2A to 2C.
Figure 3B:
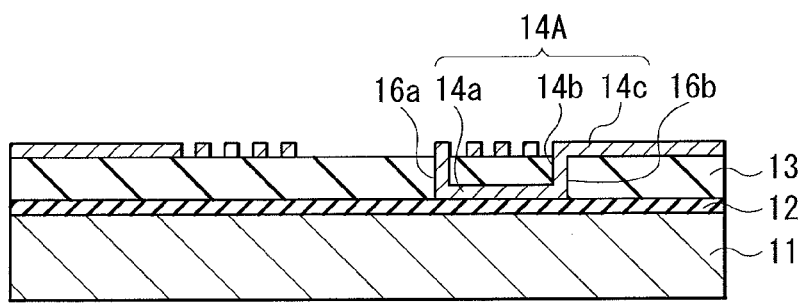

Next, as illustrated in FIG. 3A, through holes 16a and 16b reaching the metal wiring 14a are formed in the dielectric layer 13. After that, as illustrated in FIG. 3B, a metal wiring 14c as a second layer is formed in the through holes 16a and 16b and on the dielectric layer 13. Specifically, for example, as in the metal wiring 14a, AlCu is deposited, and a coil-like pattern of the inductor is formed by photolithography and dry etching. At this time, the metal wiring 14c is electrically connected to the metal wiring 14a through a via contact 14b.

Figure 3C:
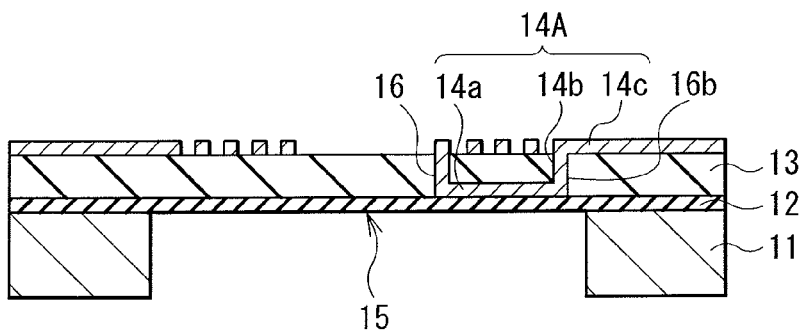

Finally, as illustrated in FIG. 3C, the aperture 15 is formed from the rear face side of the substrate 11. Specifically, for example, a hard mask is formed on the rear face of the substrate 11. After that, the substrate 11 is etched by, for example, DRIE (Deep Reactive Ion Etching) to form the aperture 15 and obtain a desired membrane structure. As etching conditions, a method of obtaining a vertical process shape by alternately repeating etching step by $SF_6$ gas and passivation step by $C_4F_8$ that is generally called BOSCH process is used. At this time, the stopper layer 12 exists between the substrate 11 and the dielectric layer 13. Thus, etching is stopped in the stopper layer 12, and the dielectric layer 13 is not damaged. Etching method is not limited to the foregoing method, but wet etching method with the use of tetramethylammonium hydroxide aqueous solution (TMAH) or the like may be used.

Figure 4A:
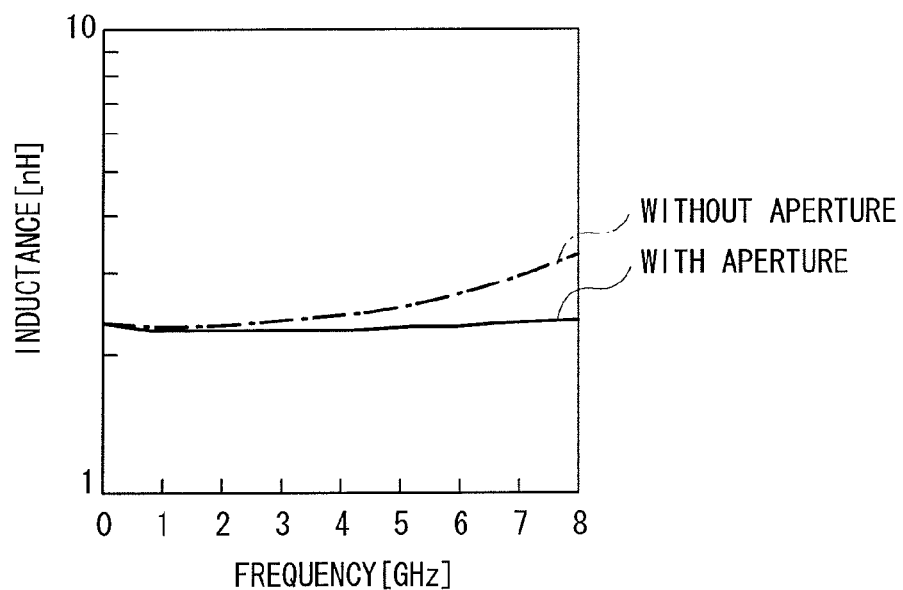
FIGS. 4A and 4B are characteristics diagrams illustrating inductance and Q value of the high frequency device illustrated in FIG. 1 together with inductance and Q value of a comparative example.
Figure 4B:
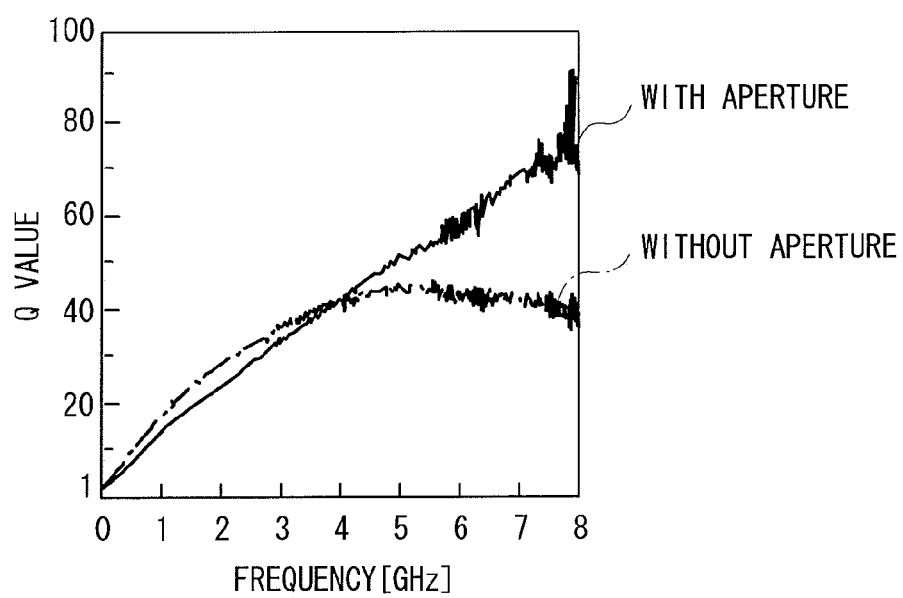

As described above, the high frequency device 1 of this embodiment has the membrane structure in which the stopper layer 12, the dielectric layer 13, and the high frequency element 14 (inductor 14A) are formed over the substrate 11, and the aperture 15 is provided in the substrate 11 in the position opposed to the high frequency element 14. FIGS. 4A and 4B illustrate comparison of an inductance (FIG. 4A) and Q value (FIG. 4B) between the high frequency device 1 having the aperture 15 and a device (comparative example) not having an aperture (not having a membrane structure). In FIG. 4A, the inductance of the comparative example is gradually increased as the frequency is increased, while the inductance of the high frequency device 1 is almost constant. In FIG. 4B, it is found that while the Q value of the comparative example peaks out at the value of about 40 in the vicinity of the frequency of 5 GHz, the Q value of the high frequency device 1 is continuously increased until the frequency about 8 GHz or more, and reaches 70. From the foregoing results, it is found that in the case where the membrane structure in which the aperture 15 is provided in the substrate 11 is included, the device is able to be used in a wide range of frequency, in particular, in the high frequency region.

Further, in the high frequency device 1 of this embodiment, the stopper layer 12 is provided between the substrate 11 and the dielectric layer 13. Thus, etching is stopped in the stopper layer 12 in forming the aperture 15 in the substrate 11. Therefore, mechanical strength of the membrane 17 is able to be improved without damaging the dielectric layer 13 included in the membrane 17. Accordingly manufacturing yield ratio is improved.

Further, the material, the film thickness and the like of the dielectric layer 13 may be freely set independently from the etching conditions of the substrate 11.

Second Embodiment

Figure 5:
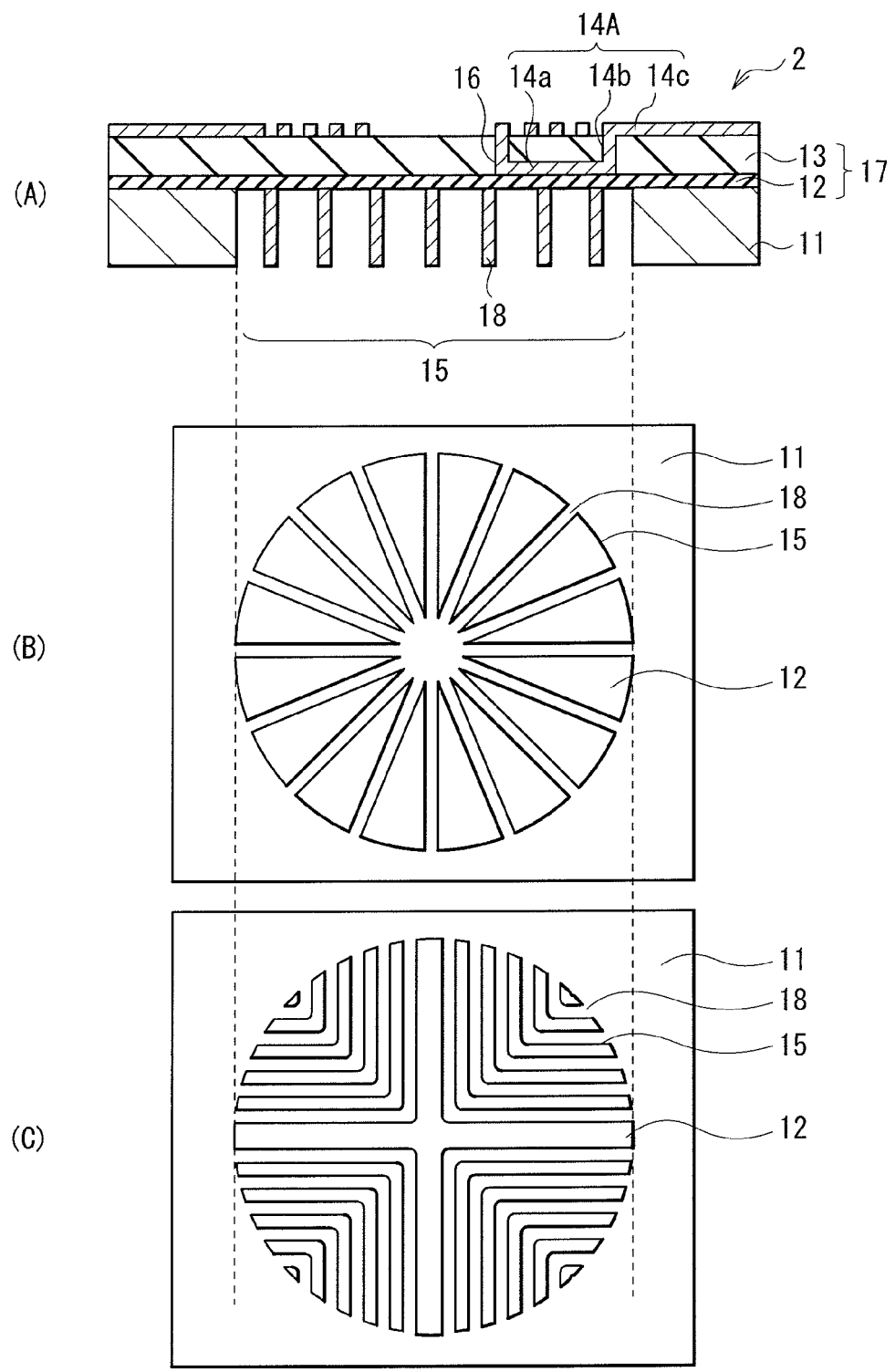
FIG. 5 is planar views and a cross sectional view of a high frequency device according to a second embodiment of the invention.

FIG. 5 illustrates a cross sectional configuration of a high frequency device 2 according to a second embodiment of the invention. Part A in FIG. 5 illustrates a cross sectional configuration of the high frequency device 2. Part B and Part C in FIG. 5 illustrate a planar configuration of the high frequency device 2 viewed from the bottom face thereof. This embodiment is suitable for a case necessitating the membrane 17 (the stopper layer 12 and the dielectric layer 13) having a larger area. For the same elements as those of the first embodiment, the same referential symbols are affixed thereto and the descriptions thereof will be omitted.

The high frequency device 2 has the stopper layer 12, the dielectric layer 13, and the high frequency element 14 (inductor 14A) over the substrate 11 similarly in the first embodiment, but is different from the first embodiment in that the high frequency device 2 has a reinforced structure 18 in the aperture 15. The reinforced structure 18 is integrated with the substrate 11, and is formed, for example, concurrently with formation of the aperture 15 in the substrate 11 by the foregoing DRIE. In the case where characteristics deterioration is generated in the high frequency element 14 by leaving part of the substrate 11 as such a reinforced structure 18, a pattern of the reinforced structure 18 is formed as a structure with which the characteristics deterioration is minimized.

The inside of the aperture 15 (that is, the high frequency element 14 on the dielectric layer 13) is divided into a plurality of regions by the pattern of the reinforced structure 18. In this case, for example, the pattern has a form radiating from the center of the aperture 15 (Part B in FIG. 5), or has a form that divides the aperture 15 into quarters in the shape of a cross (Part C in FIG. 5). Thereby, generation of an eddy current is able to be decreased, and lowering of the Q value is able to be inhibited. Other configurations are substantively similar to those of the first embodiment.

In the case where a higher inductance is necessitated as the inductor 14A, the loop diameter of the inductor 14A may be increased. To that end, the area of the membrane 17 (that is, the aperture 15) should be increased in accordance with the increased loop diameter. However, if the area of the membrane 17 is simply increased, the mechanical strength is lowered.

In the high frequency device 2 of this embodiment, in forming the aperture 15 by etching the substrate 11, part of the substrate in the aperture 15 is left to provide the reinforced structure 18. The pattern of the reinforced structure 18 divides the membrane 17 into a plurality of small regions. Thereby, lowering of the mechanical strength leading to deflection and break is able to be inhibited. Thus, in the case where the membrane 17 having a large area is included as the high frequency device 2, desired mechanical strength is obtainable, and the manufacturing yield ratio is improved.

Further, by providing the reinforced structure 18, mechanical strength of the chip itself is concurrently improved. Accordingly, handling in mounting is facilitated. As in the first embodiment, by providing the stopper layer 12 between the substrate 11 and the dielectric layer 13, damage of the dielectric layer 13 by etching is prevented.

Third Embodiment

Figure 6:
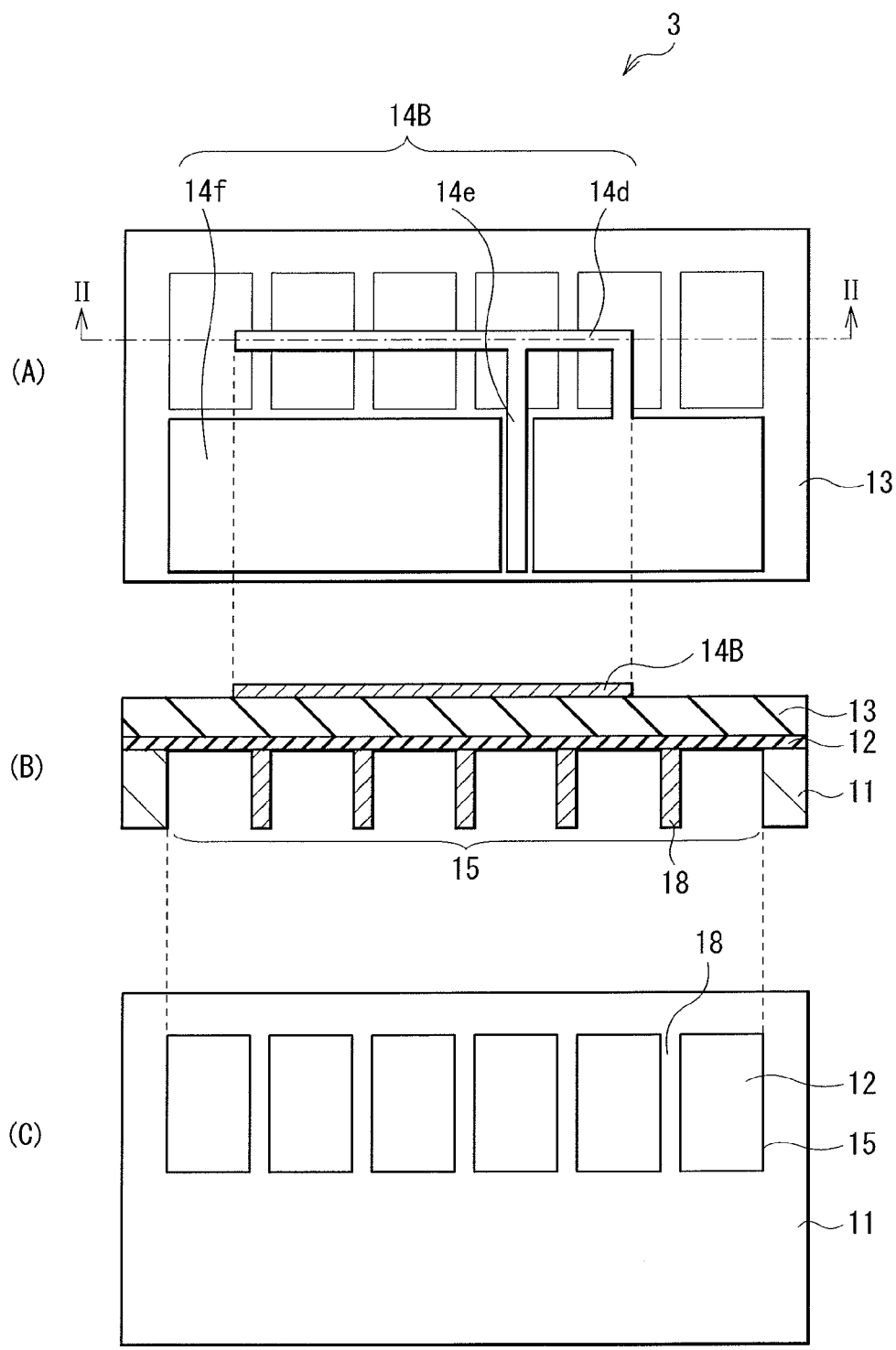
FIG. 6 is planar views and a cross sectional view of a high frequency device according to a third embodiment of the invention.

FIG. 6 illustrates a high frequency device 3 according to a third embodiment. Part A in FIG. 6 illustrates a planar configuration of the high frequency device 3 viewed from the top face thereof. Part B in FIG. 6 illustrates a cross sectional configuration taken along line II-II of Part A in FIG. 6. Part C in FIG. 6 illustrates a planar configuration of the high frequency device 3 viewed from the bottom face thereof.

The high frequency device 3 includes an antenna 14B as the high frequency element 14. The antenna 14B is an inverted F on-chip antenna composed of a linear radiating element 14d, an electric supply line 14e to supply electric power to the radiating element 14d, and a GND region 14E The reinforced structure 18 has a pattern perpendicular to the longitudinal direction of the radiating element 14d, and divides the radiating device 14d into a plurality of regions. Thereby, while influence on directivity and frequency change of the antenna 14B is suppressed, strength of the membrane 17 is able to be improved. Other configurations are substantively similar to those of the first embodiment.

Fourth Embodiment

Figure 7:
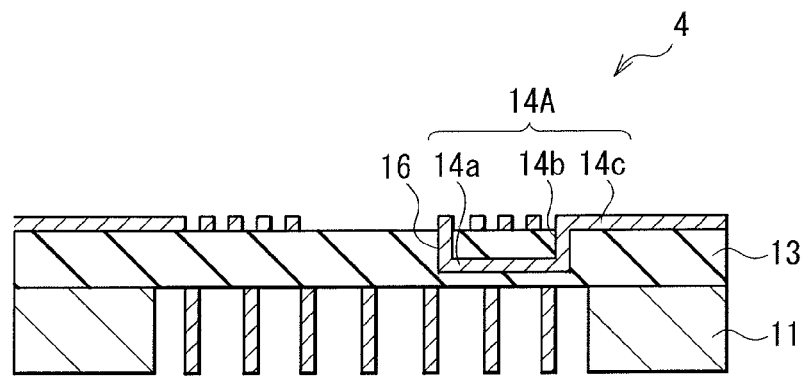
FIG. 7 is a cross sectional view of a high frequency device according to a fourth embodiment of the invention.

FIG. 7 illustrates a high frequency device 4 according to a fourth embodiment. In the second embodiment, the stopper layer 12 is provided together with the reinforced structure 18. In this embodiment, the stopper layer 12 is not provided, but only the reinforced structure 18 is provided. In this case, the aperture 15 is not necessarily an aperture penetrating the substrate 11, but may have a groove structure or a concave structure. By adopting such a structure, the mechanical strength of the membrane 17 is able to be improved.

Mounting Example

Figure 8:
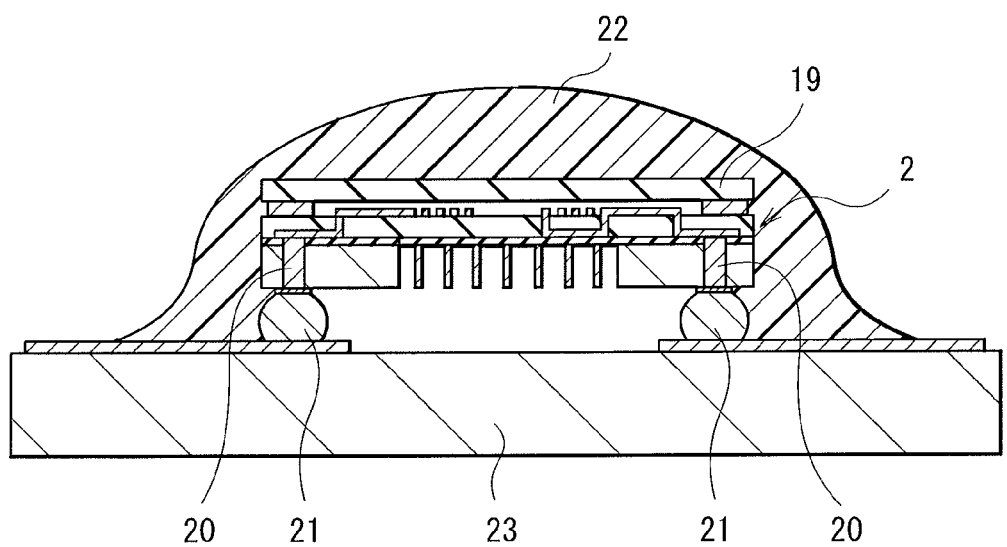
FIG. 8 is cross sectional view illustrating an example of mounting the high frequency device.

FIG. 8 illustrates an example of mounting, for example, the high frequency device 2 onto a PCB (Printed circuit board) 23. The high frequency device 2 is desirably mounted in a state of being air-tightly sealed in terms of environment resistance and long term reliability. Thus, over the membrane 17, a cap layer 19 of a wafer level package is provided by using a substrate made of, for example, glass, quartz, and silicon to seal the membrane 17. In the substrate 11 under the membrane 17, for example, a penetrating electrode (TSV) 20 is formed. Chip mounting onto the PCB 23 is performed by using the penetrating electrode 20 and a solder bump 21. After that, air-tight sealing is made by a molding resin 22. The method of mounting the high frequency device 2 is not limited to the foregoing method. It is not necessary to say that mounting with the use of a combination of various air-tight sealing methods is able to be made.

While the invention has been described with reference to the first to the fourth embodiments and the mounting example, the invention is not limited to the foregoing embodiments, and various modifications may be made. For example, in the foregoing embodiments, the high frequency element 14 is provided in the position opposed to the region in the aperture 15. However, the high frequency element 14 may protrude from the aperture 15 as long as the characteristics thereof are not substantively influenced.

Figure 9:
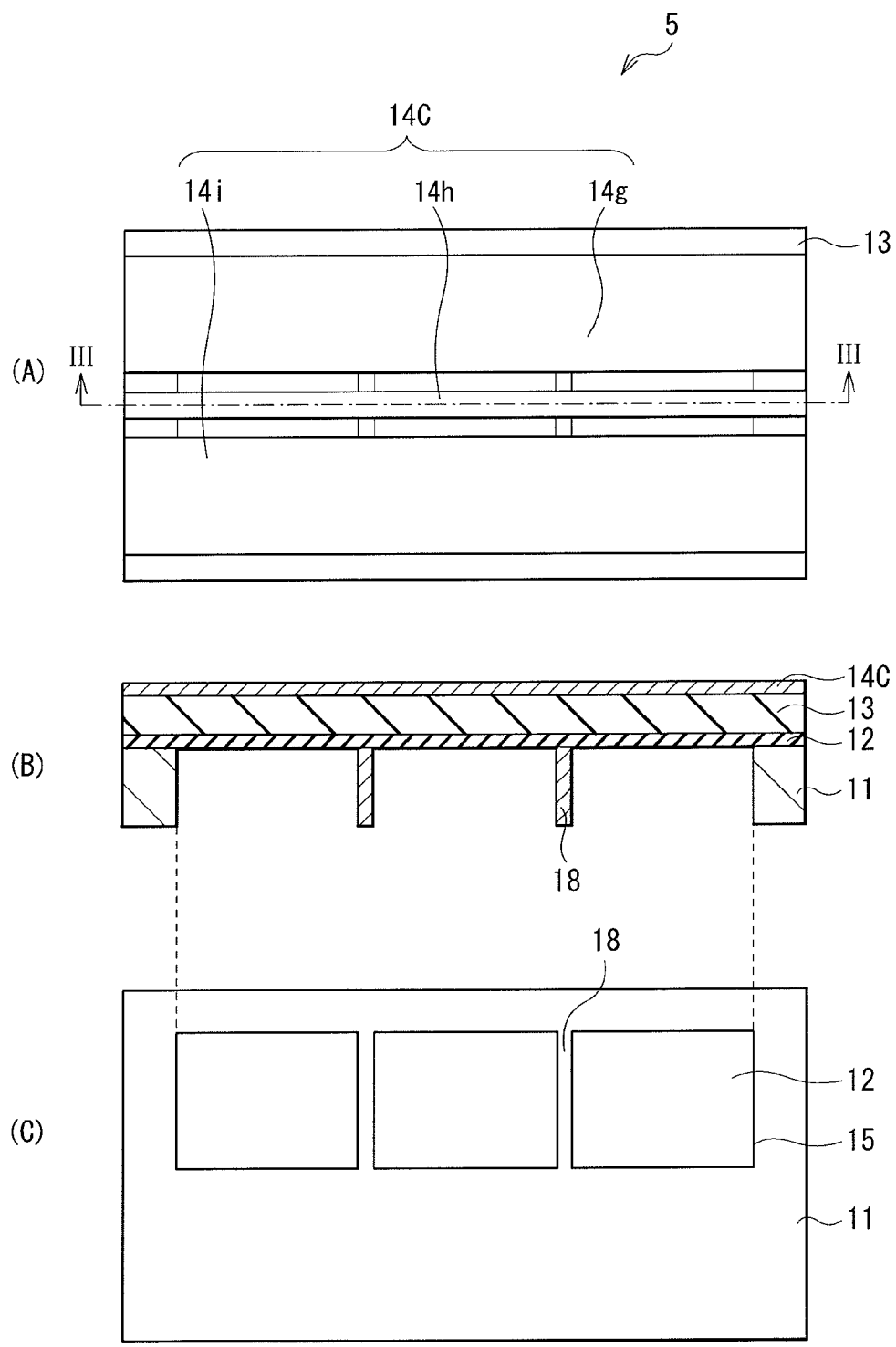
FIG. 9 is planar views and a cross sectional view illustrating a modified example of the high frequency device.

Further, the pattern of the reinforced structure 18 is not limited to the patterns of the foregoing embodiments, but other pattern may be adopted. Further, the form as the high frequency element 14 is not limited to the inductor 14A and the antenna 14B, but other form such as a capacitor and a high frequency transmission line may be adopted. FIG. 9 illustrates a high frequency device 5 applied to a coplanar waveguide, for example. Part A in FIG. 9 illustrates a planar configuration of the high frequency device 5. Part B in FIG. 9 illustrates a cross sectional configuration taken along line of Part A in FIG. 9. Part C in FIG. 9 illustrates a planar configuration of the high frequency device 5 viewed from the bottom face thereof. In particular, in the high frequency region, influence of dielectric loss caused by Si as a substrate material is large. Thus, by forming a central conductor 14h and vicinity of slots 14g and 14i on both sides of the central conductor 14h of a coplanar waveguide 14C into a membrane structure, loss is able to be suppressed. At this time, the membrane structure is extended long in the waveguide direction. Thus, by forming the reinforced structure 18 perpendicular to the waveguide direction, strength of the membrane is able to be retained.

The present application contains subject matter related to that disclosed in Japanese Priority Patent Application JP 2009-197153 filed in the Japan Patent Office on Aug. 27, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A high frequency device comprising:
   a substrate having an aperture;
   a first dielectric layer that is formed from a material having etching selectivity in relation to a material of the substrate and is provided on the substrate to cover the aperture;
   a second dielectric layer on the first dielectric layer;
   a high frequency element provided in a position opposed to the aperture on the second dielectric layer; and
   a reinforced structure for the first dielectric layer and the second dielectric layer in the substrate.

2. The high frequency device according to claim 1, wherein the reinforced structure is in the aperture of the substrate.

3. The high frequency device according to claim 1, wherein the reinforced structure is integrated with the substrate, and has a pattern dividing inside of the aperture into a plurality of regions.

4. The high frequency device according to claim 1, wherein the high frequency element is an inductor, an antenna, a capacitor, or a transmission line.

5. The high frequency device according to claim 4, wherein the high frequency element is the inductor, and the reinforced structure has a radial pattern that divides inside of the aperture from a center thereof into a plurality of regions.

6. The high frequency device according to claim 4, wherein the high frequency element is the antenna having a linear radiating element, and the reinforced structure has a pattern perpendicular to a longitudinal direction of the radiating element.

7. The high frequency device according to claim 1, wherein the substrate is formed from a conductive material.

8. The high frequency device according to claim 1, wherein the second dielectric layer is formed from an organic material.

9. The high frequency device according to claim 8, wherein the organic material is BCB, parylene, or polyimide.

10. The high frequency device according to claim 1, wherein the first dielectric layer is formed from an inorganic material.

11. The high frequency device according to claim 10, wherein the inorganic material is silicon oxide or silicon nitride.

12. A high frequency device comprising:
    a substrate having an aperture;
    a dielectric layer provided on the substrate to cover the aperture;
    a high frequency element provided in a position opposed to the aperture on the dielectric layer; and
    a reinforced structure for the dielectric layer that is integrated with the substrate, and has a pattern dividing inside of the aperture into a plurality of regions.

13. The high frequency device according to claim 12, wherein the high frequency element is an inductor, an antenna, a capacitor, or a transmission line.

14. The high frequency device according to claim 12, wherein the high frequency element is an inductor, and the reinforced structure has a radial pattern that divides inside of the aperture from a center thereof into a plurality of regions.

15. The high frequency device according to claim 12, wherein the high frequency element is an antenna having a linear radiating element, and the reinforced structure has a pattern perpendicular to a longitudinal direction of the radiating element.

16. The high frequency device according to claim 12, wherein the substrate is formed from a conductive material.

17. The high frequency device according to claim 12, wherein the second dielectric layer is formed from an organic material.

18. The high frequency device according to claim 17, wherein the organic material is BCB, parylene, or polyimide.

19. The high frequency device according to claim 12, wherein the first dielectric layer is formed from an inorganic material.

20. The high frequency device according to claim 19, wherein the inorganic material is silicon oxide or silicon nitride.

* * * * *